United States Patent [19]
Shin

[11] Patent Number: 5,814,424
[45] Date of Patent: Sep. 29, 1998

[54] HALF TONE PHASE SHIFT MASKS WITH STAIRCASE REGIONS AND METHODS OF FABRICATING THE SAME

[75] Inventor: In-kyun Shin, Seoul, Rep. of Korea

[73] Assignee: Samsung Electronics Co., Ltd., Suwon, Rep. of Korea

[21] Appl. No.: 869,559

[22] Filed: Jun. 5, 1997

[30] Foreign Application Priority Data

Jun. 29, 1996 [KR] Rep. of Korea ................... 1996 25926

[51] Int. Cl.$^6$ ....................................................... G03F 9/00
[52] U.S. Cl. ................................................................. 430/5
[58] Field of Search ................................ 430/5, 311, 322, 430/323, 324

[56] References Cited

U.S. PATENT DOCUMENTS

| | | | |
|---|---|---|---|
| 5,358,827 | 10/1994 | Garofalo et al. | 430/313 |
| 5,418,095 | 5/1995 | Vasudev et al. | 430/5 |
| 5,437,947 | 8/1995 | Hur et al. | 430/5 |

OTHER PUBLICATIONS

Brown, "*Sematech and the National Technology Roadmap : Needs and Challenges*", Optical/Laser Microlithography VII, Proceedings/SPIE–The International Society for Optical Engineering, vol. 2440, Feb. 22–24, 1995, pp. 34–35.

*Primary Examiner*—S. Rosasco
*Attorney, Agent, or Firm*—Myers Bigel Sibley & Sajovec

[57] ABSTRACT

A phase shift mask includes a phase shift region and an unshifted phase region in spaced apart relation on a phase shift mask substrate, and a half tone region on the unshifted phase region. The half tone region changes the phase of radiation incident thereon. The half tone region preferably defines a staircase region which causes destructive interference of incident radiation which can thereby reduce the critical distance difference between patterns formed with the phase shift region and the unshifted phase region. The phase shift mask may be fabricated by forming a phase shift layer on a phase shift mask substrate and forming a patterned chrome layer on the phase shift layer which exposes a first portion and a second portion of the phase shift layer. A phase shift region is formed in the first portion of the phase shift layer and a half tone region and an unshifted phase region are formed in the second portion of the phase shift layer.

17 Claims, 4 Drawing Sheets

HALF TONE PHASE SHIFT MASKS WITH STAIRCASE REGIONS AND METHODS OF FABRICATING THE SAME

FIELD OF THE INVENTION

This invention relates to microelectronic masks and mask fabrication methods and more particularly to phase shift masks and fabrication methods therefor.

BACKGROUND OF THE INVENTION

As integrated circuit devices such as semiconductor devices become more densely integrated, it may become increasingly difficult to form uniform patterns therein. This problem can be reduced or eliminated by using phase shift mask (PSM) structures rather than conventional photo mask structures. In particular, a Levenson PSM may be used to form a uniform pattern. A Levenson PSM includes an etched portion in a PSM substrate. A Levenson PSM is described in detail in U.S. Pat. No. 5,358,827.

Referring to FIG. 1, a conventional Levenson PSM is formed by sequentially forming a phase shift layer pattern 11 and a chrome layer pattern 12 which expose spaced apart regions of a PSM substrate 10. A trench 14 having a predetermined depth is formed in one of the exposed regions. The phase of radiation such as light, which is incident on the region where the trench 14 is formed is shifted by an angle of 180°. Thus, the region in which the trench 14 is formed becomes a phase shift region. The phase of a light incident on the other exposed region is not shifted. Thus, the region in which a trench is not formed becomes an unshifted phase region.

Unfortunately, when the light passing through the phase shift region is out of focus, the image of a pattern may deteriorate. Thus, as shown in FIG. 5, the difference D of a critical dimension (hereinafter, referred to as a CD) between patterns respectively formed by light passing through the phase shift region and the unshifted phase region may become large. In order to solve this problem, an undercut can be formed on the PSM substrate on which the trench is formed, or a material having a high refractivity can be used to reduce the step difference of the trench. However, these methods may not completely solve this problem.

A method for manufacturing the conventional PSM will now be described with reference to FIGS. 2–4. FIG. 2 shows the step of partially exposing the surface of a chrome layer 22. More specifically, a phase shift layer 20 and a chrome layer 22 are sequentially formed on the surface of a PSM substrate 18. A photoresist film 24 is deposited on the surface of the chrome layer 22 and then patterned, thereby exposing spaced apart regions of the chrome layer 22.

FIG. 3 shows the step of forming a chrome layer pattern 22a and a phase shift layer pattern 20a. In detail, the surface of the structure of FIG. 2 is anisotropically etched using the photoresist film 24 as a mask. The surface of the PSM substrate 18 is employed as an etch end point. As a result of the etching, the exposed portion of the chrome layer 22 of FIG. 2 and a portion of the phase shift layer 20 of FIG. 2 corresponding thereto are removed to thereby form the chrome layer and phase shift layer patterns 22a and 20a.

FIG. 4 shows the step of forming the trench 14 in the PSM substrate 18. One portion of the substrate 18 whose surface is exposed as shown in FIG. 3 is protected by a photoresist pattern (not shown). Then, the surface is anisotropically etched for a given time, thereby forming the trench 14 having a predetermined depth in the exposed substrate. The photoresist pattern protecting the exposed portion of the substrate 18 is then removed, thereby completing the conventional PSM. The portion of the substrate 18 on which the trench 14 is formed is a phase shift region, and the exposed portion of the substrate 18 on which the trench 14 is not formed is an unshifted phase region.

Unfortunately, as discussed above, when light is out of focus in the phase shift region, the difference between patterns formed due to the phase shift region and the unshifted phase region may become large, so that the uniformity of the patterns may be greatly degraded. In FIG. 5, the horizontal axis denotes the position of a line and a space, and the vertical axis denotes the light intensity according to the position designated by the horizontal axis. Reference numerals g1 and g2 are waveforms representing the light intensity according to the position of the line and space, when the focus of the light exposure is not correctly adjusted. Reference numeral g3 is a waveform representing the light intensity according to the position of the line and space, when the focus of the light exposure is correctly adjusted. Referring to FIG. 5, a portion having a high light intensity denotes a space portion, and a portion having a low light intensity denotes a line portion. The distribution of light intensity in accordance with the position of the line or space is not uniform so that a difference in light intensity is shown.

SUMMARY OF THE INVENTION

It is therefore an object of the present invention to provide improved phase shift masks and fabrication methods therefor.

It is another object of the present invention to provide phase shift masks which can reduce the difference of a critical dimension between patterns formed by radiation passing through a phase shift region and an unshifted phase region, and methods of fabricating the same.

These and other objects are provided, according to the present invention, by phase shift masks which include a phase shift region and an unshifted phase region in spaced apart relation on a phase shift mask substrate, and a half tone region adjacent the unshifted phase region, the half tone region changing a phase of radiation incident thereon. Accordingly, the half tone region can reduce the difference of a critical dimension between patterns formed by radiation passing through the phase shift region and the unshifted phase region, by forcing some of the radiation passing through the unshifted phase region to destructively interfere.

The half tone region preferably defines a staircase pattern on the unshifted phase region wherein a staircase region is wider than the unshifted phase region. The half tone region preferably comprises molybdenum silicon oxy-nitride. The phase shift region preferably includes a trench in the substrate.

Phase shift masks may be fabricated according to the present invention by forming a phase shift layer on a phase shift mask substrate. A patterned chrome layer is formed on the phase shift layer. The patterned chrome layer exposes a first portion and a second portion of the phase shift layer. A phase shift region is formed in the first portion of the phase shift layer. A half tone region and an unshifted phase region is formed in the second portion of the phase shift layer.

The phase shift region is preferably formed by removing the phase shift layer in the first portion thereof and forming a trench in the phase shift mask substrate, beneath the first portion of the phase shift layer. The half tone region is preferably formed by forming a staircase pattern between the phase shift layer and the second portion of the patterned chrome layer.

The staircase pattern is preferably formed by masking the second portion of the patterned chrome layer to expose a third portion of the phase shift layer which is narrower than the second portion of the patterned chrome layer. The exposed third portion of the phase shift layer is removed. As described above, the phase shift layer preferably comprises molybdenum silicon oxy-nitride. Accordingly, phase shift masks and fabrication methods may be used to reduce the critical dimension difference between the patterns formed on the microelectronic substrate, thereby allowing enhanced uniformity of the patterns.

DESCRIPTION OF PREFERRED EMBODIMENTS

Figure 1:
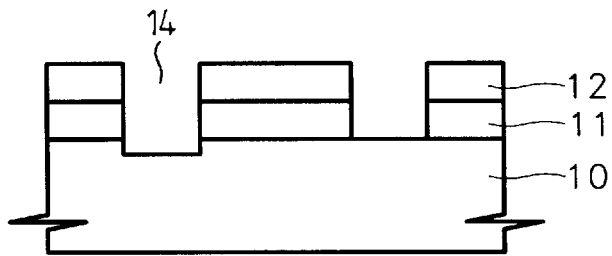
FIG. 1 is a cross-sectional view of a conventional phase shift mask.
Figure 2:
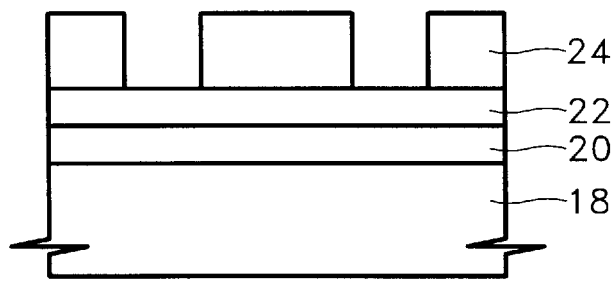
FIGS. 2 to 4 are cross-sectional views showing the steps of a method of fabricating a conventional phase shift mask.
Figure 3:
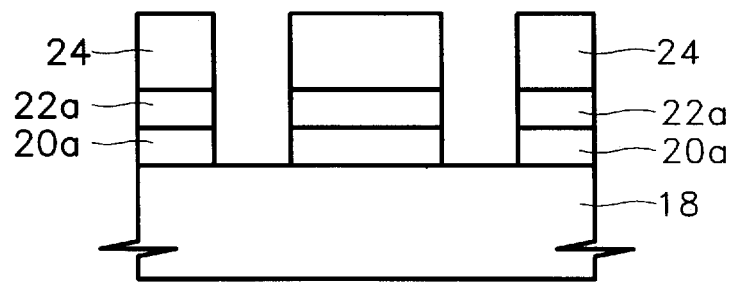
Figure 4:
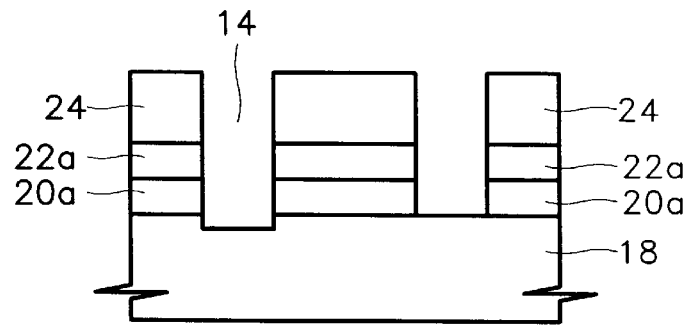
Figure 5:
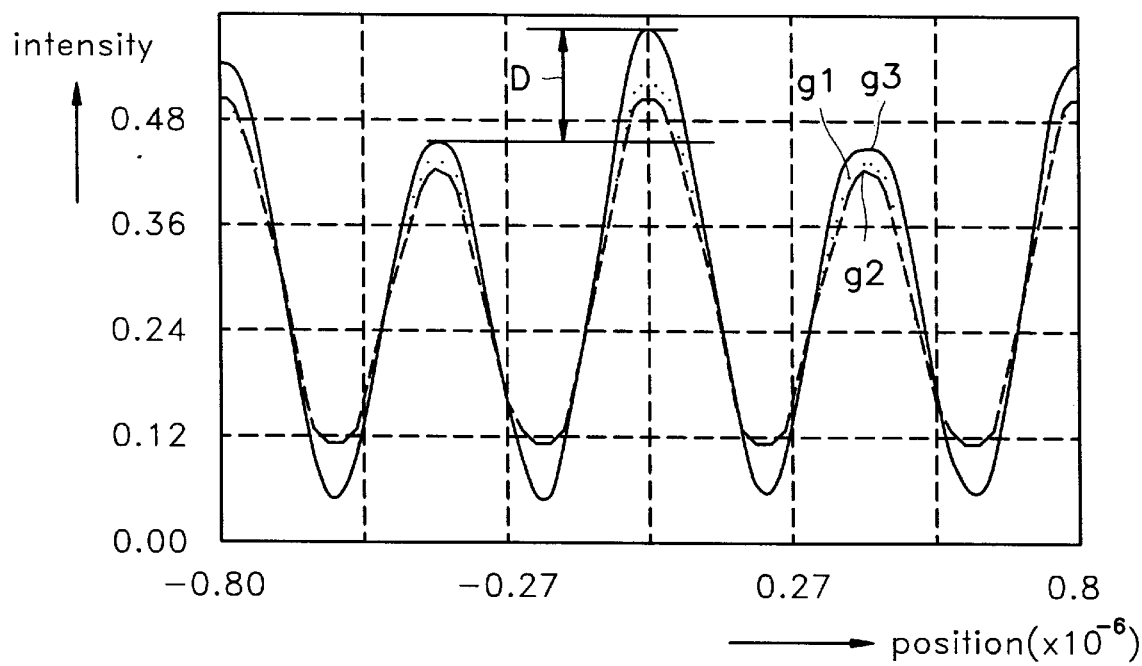
FIG. 5 is a graph showing the variation of a critical dimension caused by a conventional phase shift mask.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will also be understood that when a layer is referred to as being "on" another layer or substrate, it can be directly on the other layer or substrate, or intervening layers may also be present. Moreover, each embodiment described and illustrated herein includes its complementary conductivity type embodiment as well.

Figure 6:
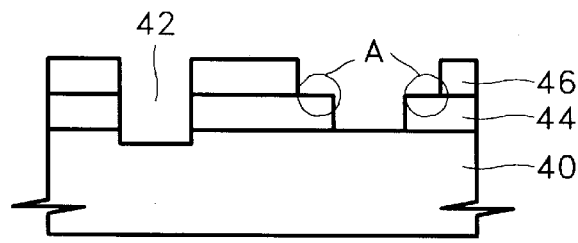
FIG. 6 is a cross-sectional view of phase shift masks according to the present invention.

Referring now to FIG. 6, a trench 42 having a predetermined depth is formed in a portion of a PSM substrate 40. In one portion of the PSM substrate 40, a phase shift layer pattern 44 and a chrome layer pattern 46 having the trench 42 are sequentially formed. In the other portion of the PSM substrate 40, a phase shift layer pattern 44 exposing the surface of PSM substrate and chrome layer pattern 46 thereon are formed. The size of the chrome layer pattern 46 is smaller than that of the phase shift layer pattern 44 formed thereunder. Thus, the phase shift layer pattern 44 and the chrome layer pattern 46 form a staircase shape on the exposed portion of the substrate 40. A flat portion A of a step is an exposed portion of the phase shift layer pattern 44, which is called a half tone region.

The trench 42 in the substrate 40 is formed to a depth such that the phase of incident light can be shifted by an angle of 180°. Light passes through the portion of the substrate in which the trench 42 is not formed, without a change in phase. Thus, the phase of light passing through the exposed portion of the substrate 40 is not shifted.

The phase of light passing through the half tone region A varies within a range of 0° to 180° according to the thicknesses of the phase shift layer pattern 44 and the PSM substrate 40. The PSM substrate 40 is preferably made of quartz and the phase shift layer pattern 44 is preferably made of molybdenum silicon oxy-nitride (MoSiON).

Figure 12:
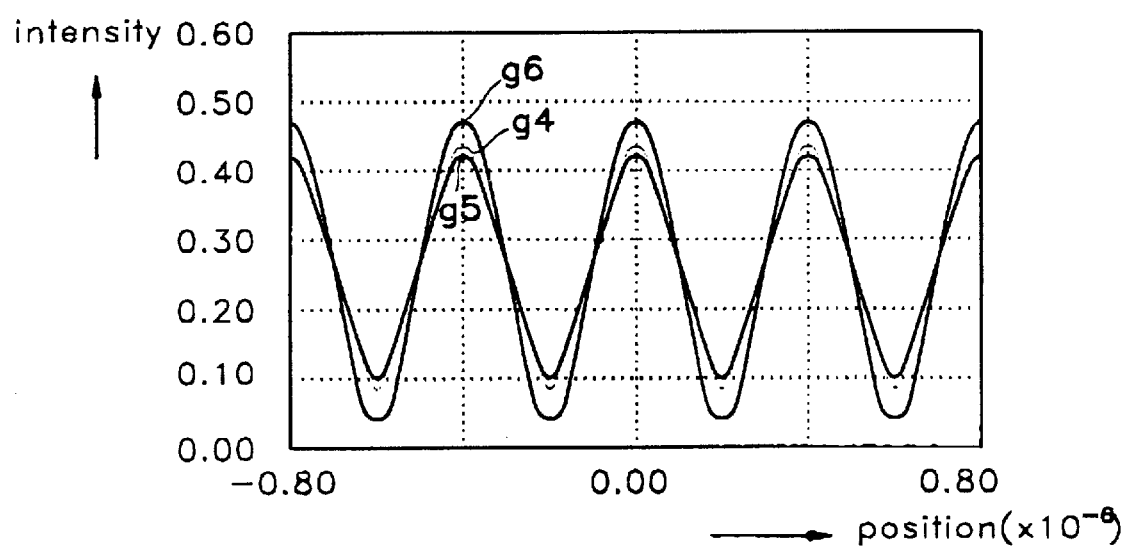
FIG. 12 is a graph showing the variation of a critical dimension caused by phase shift masks according to the present invention.

As described above, PSMs according to the present invention includes a phase shift region and an unshifted phase region where the half tone region A is partially formed. Thus, PSMs according to the present invention can reduce the range of variation of the CD as compared to the conventional PSM. That is, the range of variation between a line and a space (L/S) can be greatly reduced as compared to conventional PSMs, as shown in FIG. 12 and described below.

Figure 7:
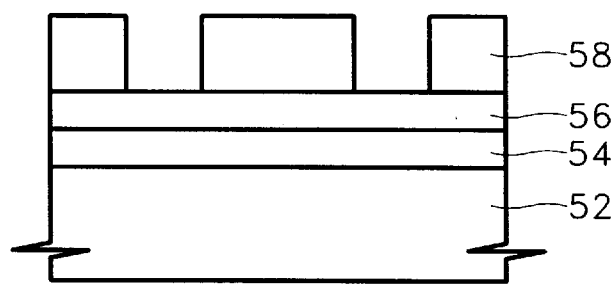
FIGS. 7 to 11 are cross-sectional views showing steps of methods of fabricating phase shift masks according to the present invention.

A method for manufacturing PSMs according to the present invention will now be described, referring to FIGS. 7 to 11. FIG. 7 shows the step of forming a first photoresist pattern 58 on a chrome layer 56 to define and expose a predetermined region of the chrome layer 56. A phase shift layer 54 and a chrome layer 56 are sequentially formed on the surface of a PSM substrate 52. Then, a photoresist film is deposited on the surface of the chrome layer 56 and patterned, thereby forming the first photoresist pattern 58 for partially defining the chrome layer 56 to expose the surface thereof. The surface of the chrome layer 56 is exposed at several places by the first photoresist pattern 58. However, FIG. 7 shows only two portions among several exposed portions of the boundary surface, for ease of illustration.

Figure 8:
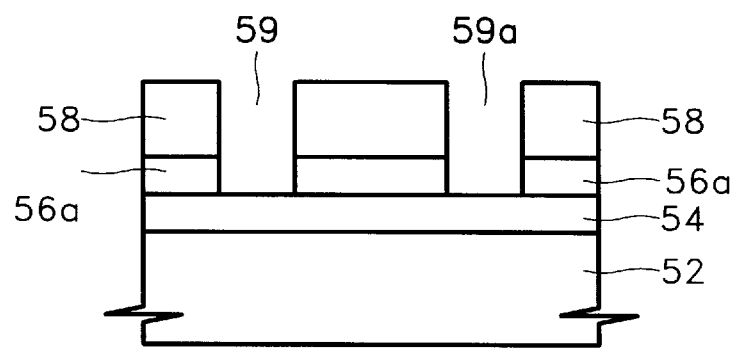

FIG. 8 shows the step of patterning the chrome layer 56 by anisotropically etching the entire surface thereof using the first photoresist pattern 58 as an etch mask. The surface of the phase shift layer 54 is used as an end point of the etching. The chrome layer 56 of FIG. 7 is patterned to form a chrome layer pattern 56a having the same shape as the first photoresist pattern 58, using the anisotropic etching process. Consequently, the surface of the phase shift layer 54 corresponding to the exposed surface of the chrome layer 56 (see FIG. 7) is exposed. The left side exposed surface in FIG. 8 is referred to as a first exposing portion 59, and the right side exposed surface is referred to as a second exposing portion 59a.

Figure 9:
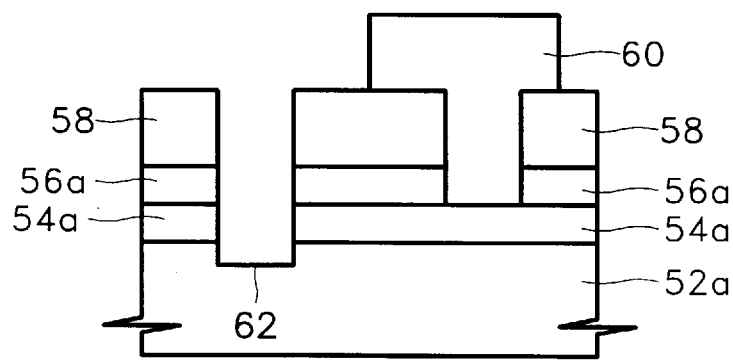

FIG. 9 shows the step of forming a trench 62 in the PSM substrate. The trench 62 is formed in the first exposing portion 59 of FIG. 8. A second photoresist pattern 60 is formed on the second exposing portion 59a of FIG. 8 to protect the same. Then, the structure is anisotropically etched for a given time. As a result of the anisotropic etching process, a portion corresponding to the first exposing portion 59 of FIG. 8 is removed to thereby form a phase shift layer pattern 54a, and a PSM substrate 52a in which the trench 62 is formed to a predetermined depth. The phase of light incident on the PSM is shifted by an angle of 180° due to the trench 62 formed in the first exposing portion 59 (see FIG. 8) of the substrate 52a.

Figure 10:
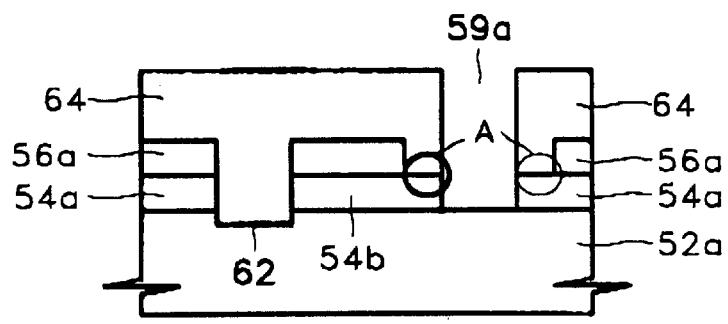

FIG. 10 shows the step of defining the second exposing portion 59a of FIG. 8, that is, a half tone region A. The first and second photoresist patterns 58 and 60 in FIG. 9 are removed. Then, a third photoresist pattern 64 for further defining the second exposing portion 59a of FIG. 8 is formed on the surface of the structure. The third photoresist pattern 64 exposes a third pattern and exposes the exposed surface of the phase shift layer pattern 54a of FIG. 9, which is exposed in the second exposing portion 59a of FIG. 8. Then the structure is anisotropically etched. The surface of the PSM substrate 52a is used as an etch end point.

Some of the phase shift layer pattern 54a (see FIG. 9) made narrower by the third photoresist pattern 64 in the second exposing portion 59a (see FIG. 8) is removed to thereby expose the surface of the substrate therebelow. The second exposing portion 59a of the PSM substrate 52a is defined more narrowly by the phase shift layer pattern 54b than by the chrome layer pattern 56a. Thus, the phase shift layer pattern 54b and the chrome layer pattern 56a in the second exposing portion 59a of FIG. 10 are different in size, unlike in the first exposing portion 59. Some of the phase shift layer pattern 54b is defined by the chrome layer pattern 56a which is formed thereon.

Figure 11:
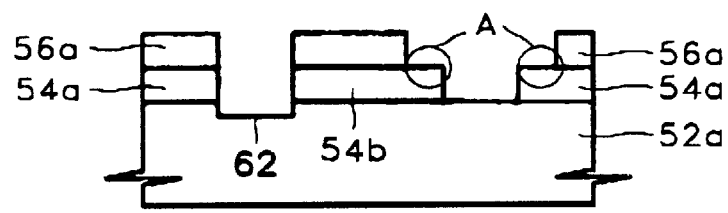

Consequently, the boundary of the chrome layer pattern 56a and the phase shift layer pattern 54b forms a staircase shape in the second exposing portion 59a as shown in FIG. 11. A flat portion A of the step is a half tone region. Light passing through the half tone region A varies in its phase within a predetermined phase angle, unlike light passing through the substrate of the adjacent second exposing portion 59a. The phase of light is changed between 0° and 180°.

Thus, some of the light passing through the half tone region A and second exposing portion 59a adjacent the half tone region A interferes destructively so that the critical dimension (CD) of a pattern formed by the light passing the second exposing portion 59a may be reduced as compared to the conventional art. Thus, comparing FIG. 1 to FIG. 12, the difference between the CD of the patterns formed by light passing through the first exposing portion 59 (see FIG. 8) in which the trench 62 is formed, and the second exposing portion 59a (see FIG. 8) according to the present invention, may be very small as compared to the conventional art.

FIG. 11 shows the step of completing PSMs according to the present invention. The third photoresist pattern 64 is removed from the structure of FIG. 10, thereby completing the PSM according to the present invention.

FIG. 12 is a graph showing the distribution of light intensity in line regions and space regions between the line regions for PSMs according to the present invention. The horizontal axis denotes a position of the line regions and space regions and the vertical axis denotes light intensity according to the position of the line regions and space regions. Here, reference numeral g4 denotes light intensity when a focus is correctly adjusted, reference numeral g5 denotes light intensity when mis-focussed by 0.5 $\mu$m, and reference numeral g6 denotes light intensity when mis-focussed by −0.5 $\mu$m. Referring to FIG. 12, a portion where the light intensity is high denotes the space region, and a portion where the light intensity is low denotes the line region. Thus, when the focus is correctly adjusted, the light intensity according to the region of the line or space is uniformly distributed through the entire surface of the substrate.

As described above, PSMs according to the present invention include a half tone region on an unshifted phase portion of a PSM substrate so that some of the light passing therethrough interferes destructively. PSMs according to the invention can thereby reduce the CD difference between the patterns formed by light passing through the phase shift region and the unshifted phase region, compared to conventional PSMs. Thus, uniformity of the patterns may be enhanced.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A phase shift mask comprising:
   a phase shift mask substrate;
   a phase shift region and an unshifted phase region in spaced apart relation on the phase shift mask substrate; and
   a half tone region on the unshifted phase region, the half tone region changing a phase of radiation incident thereon between 0° and 180°.

2. A phase shift mask according to claim 1 further comprising a trench in the substrate beneath the phase shift region.

3. A phase shift mask according to claim 1 wherein the half tone region comprises molybdenum silicon oxy-nitride.

4. A phase shift mask comprising:
   a phase shift mask substrate;
   a phase shift region and an unshifted phase region in spaced apart relation on the phase shift mask substrate; and
   a staircase region on the unshifted phase region.

5. A phase shift mask according to claim 4 wherein the staircase region is wider than the unshifted phase region.

6. A phase shift mask according to claim 4 further comprising a trench in the substrate beneath the phase shift region.

7. A phase shift mask according to claim 4 wherein the staircase region comprises molybdenum silicon oxy-nitride.

8. A method of fabricating a phase shift mask, comprising the steps of:
   forming a phase shift layer on a phase shift mask substrate;
   forming a patterned chrome layer on the phase shift layer, the patterned chrome layer exposing a first portion and a second portion of the phase shift layer;
   forming a phase shift region in the first portion of the phase shift layer; and
   forming a half tone region and an unshifted phase region in the second portion of the phase shift layer, the half tone region changing a phase of radiation incident thereon between 0° and 180°.

9. A method according to claim 8 wherein the step of forming a phase shift region comprises the steps of:
   removing the phase shift layer in the first portion thereof; and
   forming a trench in the phase shift mask substrate, beneath the first portion of the phase shift layer.

10. A method according to claim 8 wherein the step of forming a half tone region comprises the step of:
    forming a staircase pattern between phase shift layer and the second portion of the patterned chrome layer.

11. A method according to claim 10 wherein the staircase pattern forming step comprises the steps of:
    masking the second portion of the patterned chrome layer to expose a third portion of the phase shifted layer which is narrower than the second portion thereof; and
    removing the exposed third portion of the phase shift layer.

12. A method according to claim 10 wherein the phase shift layer comprises molybdenum silicon oxy-nitride.

13. A method of fabricating a phase shift mask, comprising the steps of:
    forming a phase shift layer on a phase shift mask substrate;
    forming a patterned chrome layer on the phase shift layer, the patterned chrome layer exposing a first portion and a second portion of the phase shift layer;

forming a phase shift region in the first portion of the phase shift layer; and forming a staircase region and an unshifted phase region in the second portion of the phase shift layer.

14. A method according to claim 13 wherein the step of forming a phase shift region comprises the steps of:

removing the phase shift layer in the first portion thereof; and forming a trench in the phase shift mask substrate, beneath the first portion of the phase shift layer.

15. A method according to claim 13 wherein the step of forming a staircase region comprises the step of:

forming a staircase pattern between phase shift layer and the second portion of the patterned chrome layer.

16. A method according to claim 15 wherein the staircase pattern forming step comprises the steps of:

masking the second portion of the patterned chrome layer to expose a third portion of the patterned chrome layer which is narrower than the second portion thereof; and removing the exposed third portion of the phase shift layer.

17. A method according to claim 13 wherein the phase shift layer comprises molybdenum silicon oxy-nitride.

\* \* \* \* \*